United States Patent
Tanaka

(10) Patent No.: US 8,695,497 B2
(45) Date of Patent: Apr. 15, 2014

(54) SCREEN PRINTING APPARATUS AND METHOD FOR PRINTING OF SUBSTRATE IN TWO STAGES INCLUDING TWO PRINTING MASKS AND TWO CLOSED SQUEEGEES

(75) Inventor: Tetsuya Tanaka, Yamanashi (JP)

(73) Assignee: Panasonic Corporation, Osaka (JP)

( * ) Notice: Subject to any disclaimer, the term of this patent is extended or adjusted under 35 U.S.C. 154(b) by 353 days.

(21) Appl. No.: 13/202,617

(22) PCT Filed: Jun. 22, 2010

(86) PCT No.: PCT/JP2010/004152
§ 371 (c)(1),
(2), (4) Date: Aug. 22, 2011

(87) PCT Pub. No.: WO2011/004558
PCT Pub. Date: Jan. 13, 2011

(65) Prior Publication Data
US 2011/0303108 A1    Dec. 15, 2011

(30) Foreign Application Priority Data
Jul. 8, 2009  (JP) .................................. 2009-161331

(51) Int. Cl.
*B41F 15/40*  (2006.01)
*B41F 15/08*  (2006.01)

(52) U.S. Cl.
USPC ............................ 101/123; 101/127; 101/129

(58) Field of Classification Search
USPC .................. 101/114, 123, 124, 126, 127, 129
See application file for complete search history.

(56) References Cited

FOREIGN PATENT DOCUMENTS

| JP | 61-164895 A | 7/1986 |
|----|-------------|--------|
| JP | 5-13740 U | 2/1993 |
| JP | 05-147190 A | 6/1993 |
| JP | 05-212852 A | 8/1993 |
| JP | 07-156363 A | 6/1995 |
| JP | 2000-141599 A | 5/2000 |
| JP | 2000-168040 A | 6/2000 |

(Continued)

OTHER PUBLICATIONS

International Search Report for PCT/JP2010/004152 dated Aug. 17, 2010.

*Primary Examiner* — Leslie J Evanisko
(74) *Attorney, Agent, or Firm* — Pearne & Gordon LLP

(57) ABSTRACT

There is provided a screen printing apparatus and a screen printing method which can implement printing work with good efficiency while securing a good printing quality in screen printing intended for an upper surface of a substrate and a bottom surface of a recess portion which is opened in the upper surface.

In screen printing in which a paste is printed on a cavity substrate, as a printing object, which has an upper surface printing area and a bottom surface printing area on a bottom surface of a recess portion sequentially in two stages by an upstream side printing portion and a downstream side printing portion which have closed-type squeegee mechanisms 36(1), 36(2), respectively, which each include a first sliding contact plate 54A and a second sliding contact plate 54B, when the bottom surface area becomes a printing object, the paste remaining in a depressed portion on an upper surface side of a fitting portion is scooped up by the sliding contact plate which is situated at a rear side in a squeegeeing direction for removal therefrom, whereas when the upper surface printing area becomes a printing object, the paste adhering to an upper surface of an upper surface printing mask is scraped off by the sliding contact plate which is situated at a rear side in a squeegeeing direction.

4 Claims, 8 Drawing Sheets

(56) References Cited

FOREIGN PATENT DOCUMENTS

| | | | |
|---|---|---|---|
| JP | 2001-504049 A | 3/2001 |
| JP | 2001-291952 A | 10/2001 |
| JP | 2002-001905 A | 1/2002 |
| JP | 2004-136509 A | 5/2004 |
| JP | 2006-269555 A | 10/2006 |
| JP | 2008-235761 A | 10/2008 |
| JP | 2009-70867 A | 4/2009 |

SCREEN PRINTING APPARATUS AND METHOD FOR PRINTING OF SUBSTRATE IN TWO STAGES INCLUDING TWO PRINTING MASKS AND TWO CLOSED SQUEEGEES

TECHNICAL FIELD

The present invention relates to a screen printing apparatus and a screen printing method for printing an electronic parts joining paste on an upper surface of a substrate and a bottom surface of a recess portion which is opened in the upper surface as objects.

BACKGROUND ART

In an electronic parts packaging line for fabricating packaged substrates in which electronic parts are packaged on substrates, a screen printing apparatus for printing an electronic parts joining paste on a substrate is connected to an upstream side of an electronic parts mounting apparatus for mounting electronic parts such as semiconductor devices on a substrate. Conventionally, as a type of substrate on which electronic parts are packaged, a so-called cavity substrate has been known in which electrode patterns are formed on both an upper surface of a substrate and a bottom surface of a recess portion which is opened in the upper surface of the substrate and has been in use in various types of equipment as a light, high density substrate (Patent Document 1). In a screen printing in which an electronic parts joining paste is printed on such a cavity substrate as an object, a three-dimensional screen mask is used which has a flat plate portion which is brought into contact with an upper surface of the substrate and a fitting portion which is formed to project downwards from the flat plate portion so as to fit in a recess portion in the substrate. By using the three-dimensional screen mask, the paste can be printed simultaneously on both the upper surface of the substrate and the bottom surface of the recess portion therein.

RELATED ART DOCUMENT

Patent Document

Patent Document 1: JP-A-2008-235761

SUMMARY OF THE INVENTION

Problem that the Invention is to Solve

In the screen printing designed for the cavity substrate as an object, however, there are various restrictions and problems which are attributed to the three-dimensional screen mask, and it has been difficult to implement printing work with good efficiency while securing a good printing quality. For example, in order to print the paste on the substrate in a good manner without causing any bleeding or breakage, the paste needs to be loaded appropriately in pattern holes provided in the screen mask. However, pattern holes provided in the flat plate portion and pattern holes provided in the fitting portion essentially have different paste loading conditions, and hence, in the same screen printing apparatus, it is difficult to secure a good printing quality for both printings made by the flat plate portion and the fitting portion of the screen mask. Because of this, methods have long been desired for executing printing work on a cavity substrate as an object with good efficiency while securing a good printing quality.

Then, in the screen printing designed for printing on an upper surface of a substrate and a bottom surface of a recess portion which is opened in the upper surface, an object of the invention is to provide a screen printing apparatus and a screen printing method for executing printing work with good efficiency while securing a good printing quality.

Means for Solving the Problem

According to the invention, there is provided a screen printing apparatus for printing an electronic parts joining paste on an upper printing area which is set on an upper surface of a substrate and on which an upper surface electrode is formed and a bottom surface printing area which is set on a bottom surface of a recess portion which is opened in the upper surface and on which a bottom surface electrode is formed as objects, characterized by having an upstream side printing portion and a downstream side printing portion which are disposed in series along a direction in which a substrate is transferred for printing the paste on the substrate as an object sequentially in two stages and a substrate transfer portion for transferring the substrate from the upstream side printing portion to the downstream side printing portion, and characterized in that the upstream side printing portion comprises a bottom surface printing mask which is provided to correspond to the bottom printing area and which has a fitting portion adapted to fit in the recess portion and a mask pattern formed in the fitting portion so as to correspond to the bottom surface electrode and a first closed-type squeegee mechanism which is configured to include a pair of facing sliding contact plates which extend downwards from a lower surface of a main body portion which stores the paste so as to approach each other to contract gradually a space defined therebetween as they extend downwards with the facing direction aligned with a squeegeeing direction and which supplies the paste into the fitting portion via a printing opening provided between the sliding contact plates by bringing the sliding contact plates into abutment with an upper surface of the bottom printing mask to cause them to slide in the squeegeeing direction while pressurizing the paste stored in the main body portion, in that the downstream side printing portion comprises an upper surface printing mask which is provided to correspond to the upper surface printing area and which has a mask pattern formed so as to correspond to the upper surface electrode and a second closed-type squeegee mechanism which is configured in a similar way to the first closed-type squeegee mechanism and which loads the paste into pattern holes provided in the upper surface printing mask via a printing opening provided between a pair of sliding contact plates by bringing the sliding contact plates into abutment with an upper surface of the upper surface printing mask to cause them to slide in the squeegeeing direction while pressurizing the paste stored in the main body portion, in that of the pair of sliding contact plates of the first closed-type squeegee mechanism, a sliding contact plate which is situated at a rear side in the squeegeeing direction in a squeegeeing operation intended for the bottom surface printing area as a printing object scoops out the paste remaining in a depressed portion on an upper surface side of the fitting portion for removal from the depressed portion, and in that of the pair of sliding contact plates of the second closed-type squeegee mechanism, a sliding contact plate which is situated at a rear side in the squeegeeing direction in a squeegeeing operation intended for the upper surface printing area as a printing object scrapes off the paste adhering to an upper surface of the upper surface printing mask.

According to the invention, there is provided a screen printing method for printing an electronic parts joining paste on a substrate as an object sequentially in two stages by an upstream side printing portion and a downstream side printing portion which are disposed in series along a substrate transferring direction to be intended respectively for an upper printing area which is set on an upper surface of the substrate and on which an upper surface electrode is formed and a bottom surface printing area which is set on a bottom surface of a recess portion which is opened in the upper surface and on which a bottom surface electrode is formed, characterized by comprising a bottom surface printing step implemented by the upstream side printing portion intended for the bottom surface printing area in which the substrate is aligned with a bottom surface printing mask which has a fitting portion provided to correspond to the bottom surface printing area and adapted to fit in the recess portion and a mask pattern formed in the fitting portion so as to correspond to the bottom electrode and a first closed-type squeegee mechanism which is configured to include a pair of facing sliding contact plates which extend downwards from a lower surface of a main body portion which stores the paste so as to approach each other to contract gradually a space defined therebetween as they extend downwards with the facing direction aligned with a squeegeeing direction is brought into abutment with an upper surface of the bottom surface printing mask so as to supply the paste into the fitting portion via a printing opening provided between the sliding contact plates by bringing the sliding contact plates into abutment with the upper surface of the bottom printing mask to cause them to slide in the squeegeeing direction while pressurizing the paste stored in the main body portion and an upper surface printing step implemented by the downstream side printing portion intended for the upper surface printing area in which the substrate is aligned with an upper surface printing mask which is provided to correspond to the upper surface printing area and which has a mask pattern formed so as to correspond to the upper surface electrode and a second closed-type squeegee mechanism which is configured in a similar way to the first closed-type squeegee mechanism is brought into abutment with an upper surface of the upper surface printing mask so as to load the paste into pattern holes provided in the upper surface printing mask via a printing opening provided between a pair of sliding contact plates by bringing the sliding contact plates into abutment with the upper surface of the upper surface printing mask to cause them to slide in the squeegeeing direction while pressurizing the paste stored in the main body portion, and characterized in that in the bottom surface printing step, of the pair of sliding contact plates of the first closed-type squeegee mechanism, a sliding contact plate which is situated at a rear side in the squeegeeing direction in a squeegeeing operation scoops out the paste remaining in a depressed portion on an upper surface side of the fitting portion for removal from the depressed portion, and in that in the upper surface printing step, of sliding contact plates of the second closed-type squeegee mechanism, a sliding contact plate which is situated at a rear side in the squeegeeing direction in a squeegeeing operation scrapes off the paste adhering to the upper surface of the upper surface printing mask.

Advantage of the Invention

According to the invention, in the screen printing apparatus for printing the electronic parts joining paste on the upper printing area which is set on the upper surface of the substrate and on which the upper surface electrode is formed and the bottom surface printing area which is set on the bottom surface of the recess portion which is opened in the upper surface and on which the bottom surface electrode is formed sequentially in the two stages by the upstream side printing portion and the downstream side printing portion, in the squeegeeing operation intended for the bottom surface printing area which is the printing object by the upstream side printing portion, the paste remaining in the depressed portion on the upper surface side of the fitting portion is scooped out by the sliding contact plate of the pair of sliding plates of the closed-type squeegee mechanism which is situated at the rear side in the squeegeeing direction in the squeegeeing operation for removal from the depressed portion, and in the squeegeeing operation intended for the upper surface printing area which is the printing object by the downstream side printing portion, the paste adhering to the upper surface of the upper surface printing mask is scraped off by the sliding contact plate of the pair of sliding contact plates of the closed-type which is situated at a rear side in the squeegeeing direction in a squeegeeing operation scrapes off. Thus, the printing work can be implemented with good efficiency while securing a good printing quality.

BRIEF DESCRIPTION OF THE DRAWINGS

FIGS. 2(a) and 2(b) shows explanatory drawings of a substrate which constitutes a packaging object of an electronic parts packaging line of the embodiment of the invention, of which FIG. 2(a) is a plan view and FIG. 2(b) is a sectional view.

MODE FOR CARRYING OUT THE INVENTION

Figure 1:
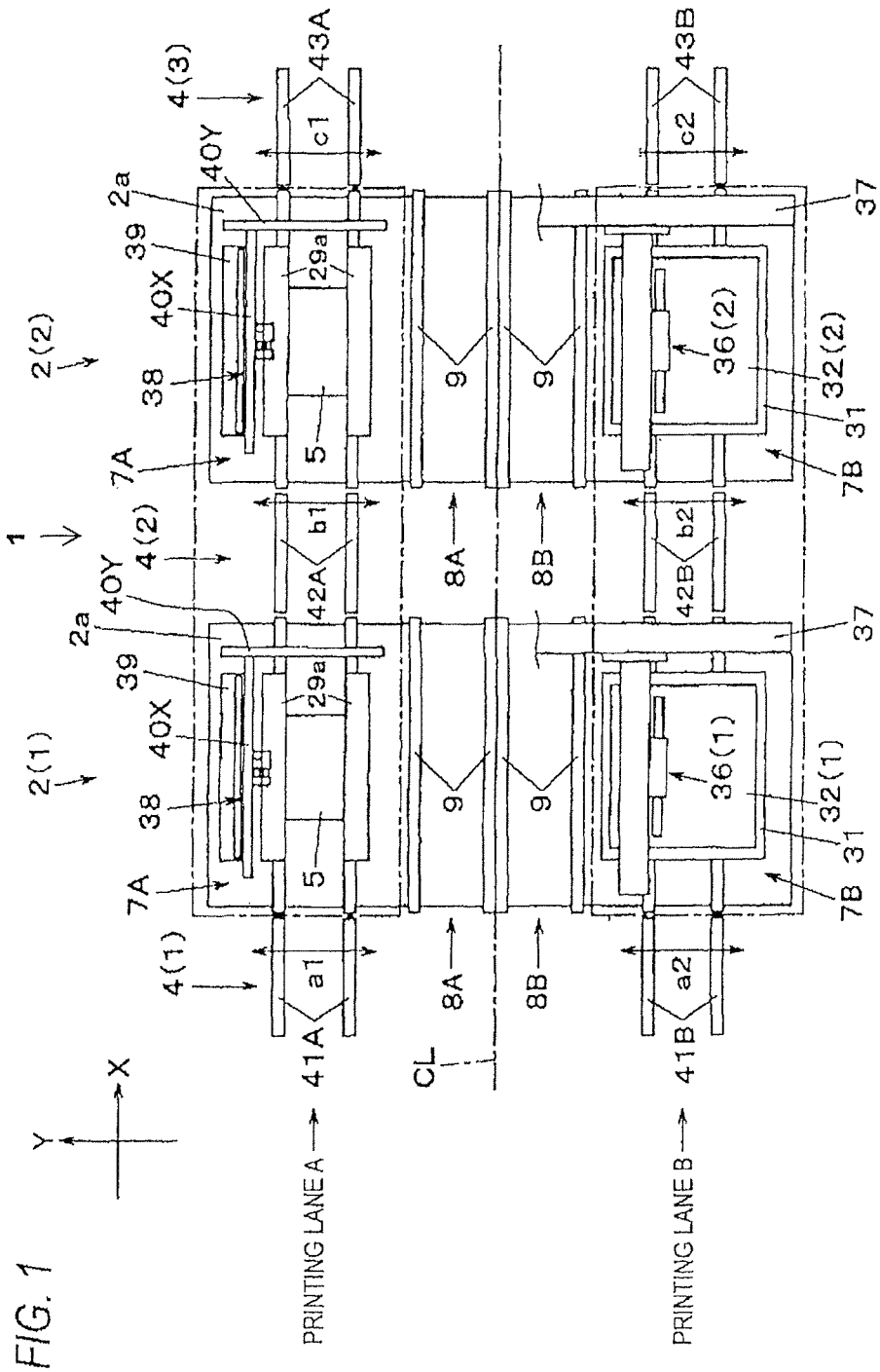
FIG. 1 is a plan view of a screen printing apparatus of an embodiment of the invention.

Firstly, referring to FIG. 1, a screen printing apparatus 1 will be described. In an electronic parts packaging line for fabricating packaged substrates by packaging electronic parts on substrates 5, the screen printing apparatus 1 is disposed on an upstream side of an electronic parts mounting apparatus for mounting electronic parts on substrates and has a function to print an electronic parts joining paste on substrates. In this description, parenthesized reference numerals such as (1), (2) . . . added to devices denote orders from an upstream side of the electronic parts packaging line in which the devices are arranged therealong.

The screen printing apparatus 1 includes an upstream side printing portion 2(1) and a downstream side printing portion 2(2) which are disposed in series along a substrate transferring direction (an X direction). Substrate distribution devices 4(1), 4(2) are added to an upstream side and a downstream side of the upstream side printing portion 2(1), respectively, and further, a substrate distribution device is added to a downstream side of the downstream side printing portion 2(2). A substrate 5 which is transferred from an upstream side device is transferred to the upstream side printing portion 2(1) via the substrate distribution device 4(1), where a screen printing is implemented on the substrate 5 by the upstream side printing portion 2(1) in which a screen mask 32(1) is installed. Then, the substrate 5 on which the screen printing has been so implemented is transferred to the downstream side printing portion 2(2) in which a screen mask 32(2) is installed via the substrate distribution device 4(2). Further, the substrate 5 on which a screen printing is implemented by the downstream side printing portion 2(2) is transferred to the electronic parts mounting apparatus (whose illustration is omitted) which is disposed downstream of the screen printing apparatus via the substrate distribution device 4(3).

Figure 2A:
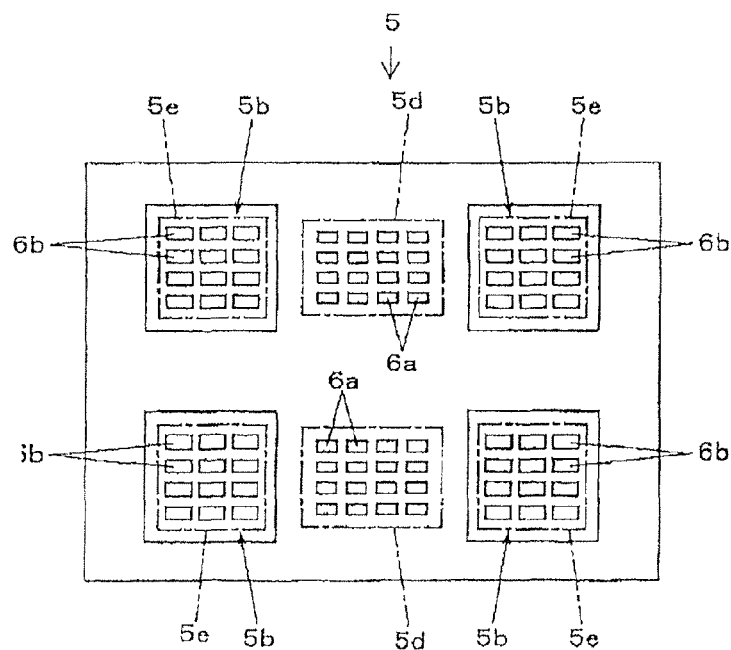
Figure 2B:
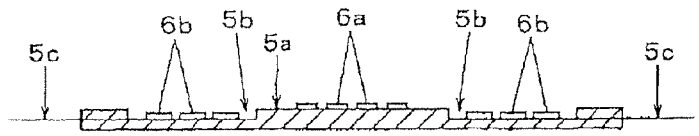

Here, referring to FIGS. 2, 3 and 4, the substrate 5 which is an object of packaging work by the electronic parts packaging line (the screen printing apparatus 1) and screen masks which are used in screen printing intended to be implemented on the substrate 5 will be described. Here, the substrate 5 takes a form having two types of printing surfaces having different heights. Namely, as is shown in FIG. 2(b), a plurality of (here, two) upper surface printing areas 5d on each of which a plurality of upper surface electrodes 6a are formed are set on an upper surface 5a of a central portion of the substrate 5. As is shown in FIG. 2(a), recess portions 5b having bottom surfaces 5c whose height is lower than that of the upper surface 5a are formed in proximity to respective corner portions of the substrate 5, and a plurality of bottom surface electrodes 6b are formed on each of bottom surface printing areas 5e set on the bottom surfaces 5c.

The upstream side printing portion 2(1) and the downstream side printing portion 2(2) print an electronic parts joining paste on the bottom surface printing areas 5e in the recess portions 5b and the upper surface printing areas 5b set on the upper surface 5a, respectively. Namely, the screen mask 32(1) installed in the upstream side printing portion 2(1) is a bottom surface printing mask, and the screen mask 32(2) installed in the downstream side printing portion 2(2) is an upper surface printing mask.

Figure 3A:
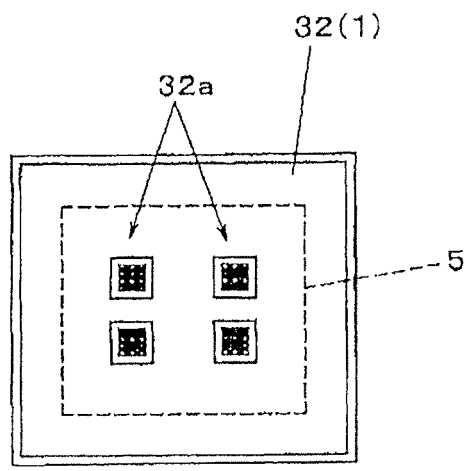
FIGS. 3(a), 3(b) show plan views of screen masks included in the screen printing apparatus of the embodiment of the invention.
Figure 3B:
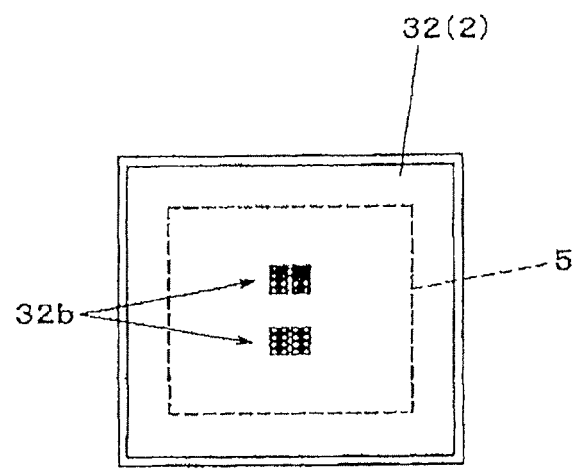
Figure 4A:
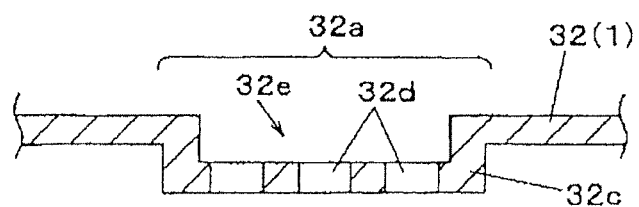
FIGS. 4(a), 4(b) are partial sectional views of the screen masks included in the screen printing apparatus of the embodiment of the invention.
Figure 4A:
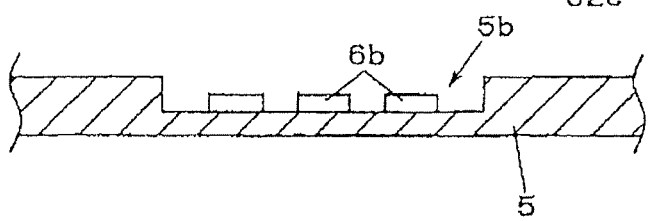
Figure 4B:
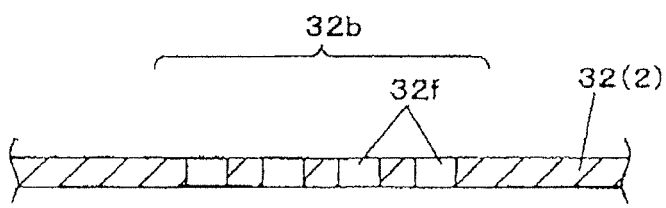
Figure 4B:
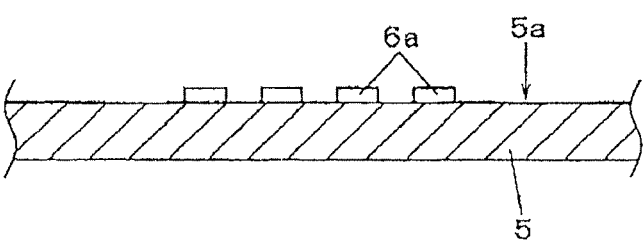

FIG. 3 shows mask patterns which are formed in the screen masks 32(1), 32(2). As is shown in FIG. 3(a), mask patterns 32a which correspond to the bottom screen areas 5e are formed in the screen mask 32(1). As is shown in FIG. 4(a), fitting portions 32c, which are shaped to fit in the corresponding recess portions 5b, are provided on the mask patterns 32a so as to project from the screen mask 32(1) to a lower surface side thereof in accordance with an arrangement of the recess portions 5b on the substrate 5, and an upper surface of the fitting portion 32c is made into a depressed portion 32e which is depressed from the screen mask 32(1). Pattern holes 32d are formed in an interior of the depressed portion 32e in accordance with an arrangement of the bottom surface electrodes 6b in the recess portion. In addition, as is shown in FIG. 3(b), mask patterns 32b which correspond to the upper surface areas 5d are formed in the screen mask 32(2). As is shown in FIG. 4(b), pattern holes 32f are formed in each of the mask patterns 32b in accordance with an arrangement of the upper surface electrodes 6a on the upper surface 5a of the substrate 5.

Namely, in the embodiment, the upstream side printing portion 2(1) and the downstream side printing portion 2(2) are disposed in series along the substrate transferring direction (the X direction) in the electronic parts packaging line (the screen printing apparatus 1) and print a creamed solder on the substrate 5 sequentially in two stages. The substrate distribution device 4(2) which is interposed between the upstream side printing portion 2(1) and the downstream side printing portion 2(2) functions as a substrate transfer portion for transferring the substrate 5 from the upstream side printing portion 2(1) to the downstream side printing portion 2(2).

The upstream side printing portion 2(1) and the downstream side printing portion 2(2) each include a first screen printing portion 7A and a second screen printing portion 7B each having a function to print a paste on a substrate 5 which constitutes an object of packaging work which are disposed on a common base table 2a so as to be symmetrical with each other with respect to a line's center line CL of the electronic parts packaging line (the screen printing apparatus 1) as viewed from the top thereof. Two lines of substrate transfer portions 8A, 8B are provided in a middle portion between the first screen printing portion 7A and the second screen printing portion 7B for transferring a substrate 5 forwards and backwards in the substrate transferring direction (the X direction).

As is shown in FIG. 1, the substrate transfer portions 8A, 8B are arranged in the X direction along the line's center line CL in the middle portion between the first screen printing portion 7A and the second screen printing portion 7B on an upper surface of the base table 2a. The substrate transfer portions 8A, 8B each include a substrate transfer mechanism 9 including a substrate transferring conveyor mechanism which is arranged in the X direction on the base table 2a, so that a substrate 5 can be transferred in both forward and backward directions by the substrate transfer mechanism 9. Namely, by driving the conveyor mechanisms of the substrate transfer mechanisms 9 in a downstream side direction, substrates 5 which are fed from the upstream side apparatus can be transferred to the downstream side apparatus by bypassing the first screen printing portion 7A and the second screen printing portion 7B of the printing portion 2 (the upstream side printing portion 2(1), the downstream side printing portion 2(2)). As this occurs, the substrate transfer portions 8A, 8B each function as a bypassing transfer path. In addition, by driving the conveyor mechanisms of the substrate transfer mechanisms 9 in an upstream side direction, the substrates 5 can be transferred to the upstream side of the printing portion 2 (the upstream side printing portion 2(1), the downstream side printing portion 2(2)). As this occurs, the substrate transfer portions 8A, 8B each function as a return transfer path for returning the substrate 5 which is once transferred to the downstream side apparatus to the upstream side.

The substrate distribution device 4(1) added to the printing portion 2 (the upstream side printing portion 2(1)) includes distribution conveyors 41A, 41B which each include a substrate transferring conveyor mechanism, and similarly, the substrate distribution devices 4(2), 4(3) which are added to the upstream side and downstream side of the printing portion 2 (the downstream side printing portion 2(2)) include distribution conveyors 42A, 42B and distribution conveyors 43A, 43B, respectively. These distribution conveyors 41A, 41B, distribution conveyors 42A, 42B and distribution conveyors 43A, 43B are made to move individually in a Y direction by a transfer rail moving mechanism (whose illustration is omitted) (refer to arrows a1, a2, b1, b2, c1, c2).

By the movement of these distribution conveyors in the Y direction, in the substrate distribution device 4(1), the distribution conveyors 41A, 41B, which are connected, respectively, to the first screen printing portion 7A and the second screen printing portion 7B of the upstream side printing portion 2(1) in the normal state, can be connected to the substrate transfer mechanism 9 of the substrate transfer portion 8A or the substrate transfer portion 8B and further to substrate transfer mechanisms 28 of the other screen printing portion which is paired with the one screen printing portion in the same printing portion 2 (the upstream side printing portion 2(1), the downstream side printing portion 2(2)) as required. Further, in the substrate distribution device 4(2), the distribution conveyors 42A, 42B, which are connected, respectively, to the first screen printing portion 7A and the second screen printing portion 7B of the downstream side printing portion 2(2) in the normal state can be connected to the substrate transfer mechanism 9 of the substrate transfer portion 8A or the substrate transfer portion 8B as required.

By doing so, the substrates 5 which are transferred to the substrate distribution device 4(1) from the upstream side apparatus can not only be transferred to the first screen printing portion 7A and the second screen printing portion 7B of the upstream side printing portion 2(1) so as to constitute objects of screen printing but also be transferred to the substrate distribution device 4(2) by the substrate transfer portion 8A or the substrate transfer portion 8B by bypassing the first screen printing portion 7A and the second screen printing portion 7B. Similarly, the substrates 5 which are transferred to the substrate distribution device 4(2) can not only be transferred to the first screen printing portion 7A and the second screen printing portion 7B of the downstream side printing portion 2(2) so as to constitute objects of screen printing but also be transferred to the mounting apparatus (not shown) which is the downstream side apparatus via the substrate distribution device 4(3) by the substrate transfer portion 8A or the substrate transfer portion 8A by bypassing the first screen printing portion 7A and the second screen printing portion 7B.

As is shown in FIG. 1, a head X-axis table 40x which is moved in the Y direction by a head Y-axis table 40Y is provided in each of the first screen printing portion 7A and the second screen printing portion 7B. A camera head unit 38 and a mask cleaning unit 39 are installed on the head X-axis table 40X. The camera head unit 38 includes a substrate recognition camera 38a for capturing an image of the substrate 5 from thereabove and a mask recognition camera 38b for capturing an image of the screen mask 32(1) or 32(2) from therebelow. The mask cleaning unit 39 includes a cleaning head for cleaning a lower surface of the screen mask 32.

By moving the camera head unit 38 and the mask screen cleaning unit 39 horizontally by driving the head X-axis table 40X and the head Y-axis table 40Y, not only can the recognition of the substrate 5 and the recognition of the screen mask 32 be implemented simultaneously but also the cleaning of the lower surface of the screen mask 32 can be implemented as required. When these operations are not implemented, the camera head unit 38 and the mask screen cleaning unit 39 are situated in a position lying aside from a position above a substrate positioning portion 21.

Figure 5:
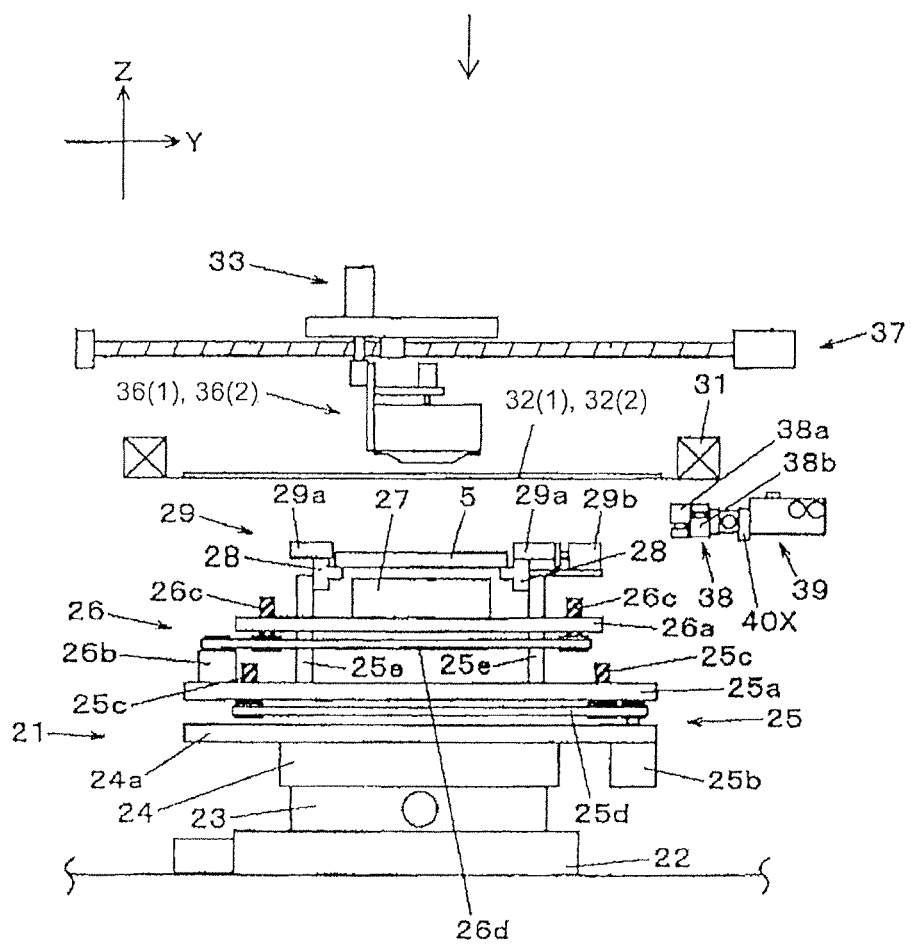
FIG. 5 is a sectional view of a screen printing portion of the screen printing apparatus of the embodiment of the invention.

As is shown in FIG. 5, the substrate positioning portion 21 is provided on each of the first screen printing portion 7A and the second screen printing portion 78 which are disposed in a symmetrical fashion on the base table 2a of each of the upstream side printing portion 2(1) and the downstream side printing portion 2(2) for positioning a substrate 5 in a printing position to hold the substrate 5 therein. Arranged above the substrate positioning portions 21 are the screen masks 32(1), 32(2) which are stretched in corresponding mask frames 31 and squeegee moving mechanisms 37 which slide a first closed-type squeegee mechanism 36(1) and a second closed-type squeegee mechanism 36(2) above the screen mask 32(1), 32(2) to which a paste has already been supplied.

In FIG. 5, the substrate positioning portion 21 includes a Y-axis table 22, an X-axis table 23 and a θ-axis table 24 which are stacked one on another, as well as a first Z-axis table 25 and a second Z-axis table 26 which are stacked on those tables in combination therewith. The configuration of the first Z-axis table 25 will be described. Held on an upper surface side of a horizontal base plate 24a which is provided on an upper surface of the θ-axis table 24 is a similarly horizontal base plate 25a which can freely be raised or lowered by a raising/lowering guide mechanism (whose illustration is omitted). The base plate 25a is raised or lowered by a Z-axis raising/lowering mechanism in which a plurality of feed screws 25c are driven to rotate by a substrate moving Z-axis motor 25b via a belt 25d. Two vertical frames 25e are erected on the base plate 25a, and a pair of substrate transfer mechanisms 28 which constitute a substrate transfer path are held at upper end portions of the vertical frames 25e.

The substrate transfer mechanisms 28 are arranged in parallel in the substrate transferring direction (the X direction—in FIG. 5, a vertical direction to the surface of a sheet of paper on which FIG. 5 is drawn), and a substrate 5, which constitutes an object of printing, is transferred while being supported at end portions thereof by conveyor mechanisms provided on the substrate transfer mechanisms 28. By driving the first Z-axis table 25, the substrate 5 held by the substrate transfer mechanisms 28 can be raised or lowered relative to the screen printing mechanism together with the substrate transfer mechanisms 28.

The configuration of the second Z-axis table 26 will be described. A horizontal base plate 26a is disposed at a middle portion between the substrate transfer mechanisms 28 and the base plate 25a so as to be raised or lowered along a raising/lowering guide mechanism (whose illustration is omitted). The base plate 26a is raised or lowered by a Z-axis raising/lowering mechanism in which a plurality of feed screws 26c are driven to rotate by a bearing portion raising/lowering motor 26b via a belt 26d. A substrate bearing portion 27 is detachably installed on an upper surface of the base plate 26a. The substrate bearing portion 27 supports the substrate 5 which is transferred to the printing position where the substrate 5 is printed by the screen printing mechanism to hold it from therebelow.

In printing operations by the first screen printing portion 7A and the second screen printing portion 7B, the substrate transfer mechanisms 28 receive substrates 5 which are fed from the upstream side apparatus via the distribution conveyors 41A, 41B of the substrate distribution device 4(1) and transfer the substrates 5 to the printing positions where the substrates 5 are printed by the screen printing mechanisms to position them therein. Then, the substrates 5 which have been subjected to printing by the screen printing mechanism are transferred out of the printing positions by the substrate transfer mechanisms 28 and are then transferred to the distribution conveyors 42A, 42B of the substrate distribution device 4(2).

The substrate bearing portion 27 is raised or lowered relative to the substrate 5 which is held to the substrate transfer mechanisms 28 by driving the second Z-axis table 26. Thus, the substrate bearing portion 27 supports the substrate 5 from a lower surface side thereof by a bearing surface of the substrate bearing portion 27 being brought into abutment with a lower surface of the substrate 5. A clamping mechanism 29 is arranged on upper surfaces of the substrate transfer mechanisms 28. The clamping mechanism 29 includes two clamping members 29a which are disposed so as to face each other in a left-to-right direction, and the substrate 5 is fixedly clamped from both sides thereof by causing one of the clamping members 29a to be advanced or retreated by driving mechanism 29b.

Figure 6:
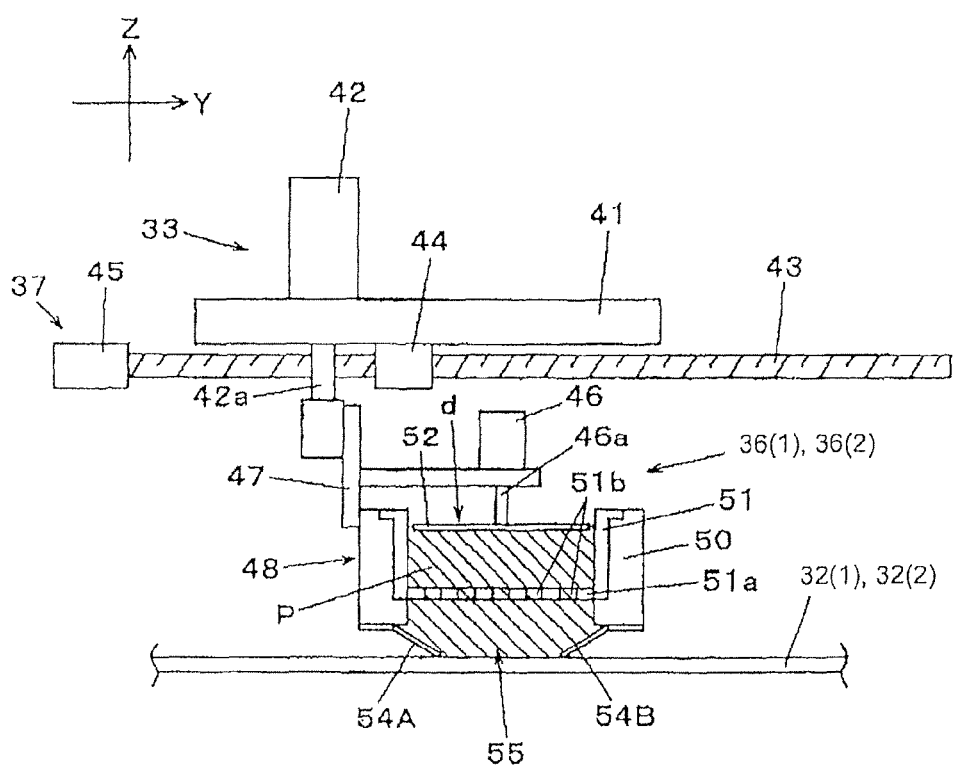
FIG. 6 is an explanatory drawing of the configuration of a closed-type squeegee mechanism for use in the screen printing apparatus of the embodiment of the invention.

Next, referring to FIG. 6, the configurations of the first closed-type squeegee mechanism 36(1), second closed-type squeegee mechanism 36(2) and squeegee moving mechanism 33. The squeegee moving mechanism 33 includes the Y-axis moving mechanism 37 which moves a movable plate 41 in the Y direction (a squeegeeing operation direction) and a squeegee raising/lowering mechanism 42 provided on an upper surface of the movable plate 41. The squeegee raising/lowering mechanism 42 includes an air cylinder, and the closed-type squeegee mechanism 36 is connected to a lower end portion of a raising/lowering shaft 42a which projects downwards from the squeegee raising/lowering mechanism 42 via a connecting member 47. The first closed-type squeegee mechanism 36(1) and the second closed-type squeegee mechanism 36(2) are raised or lowered relative to the corresponding screen masks 32(1), 32(2) by driving the squeegee raising/lowering mechanism 42s, so that the first closed-type squeegee mechanism 36(1) and the second closed-type squeegee mechanism 36(2) can be pressed against the corresponding screen masks 32(1), 32(2) at a predetermined printing pressure.

The configuration of the Y-axis moving mechanism 37 will be described. A nut member 44 is assembled to a lower surface of the movable plate 41, and a feed screw 43 which is screwed in the nut 44 is driven to rotate by a motor 45. The movable plate 41 moves horizontally by driving the motor 45. Consequently, the first closed-type squeegee mechanism 36(1) or the second closed-type squeegee mechanism 36(2) which is assembled to the squeegee raising/lowering mechanism 42 also moves horizontally over the screen mask 32(1) or the screen mask 32(2) by driving the motor 45 in that state. Namely, the motor 45, the feed screw 43 and the nut member 44 make up the Y-axis moving mechanism 37 which moves the first closed-type squeegee mechanism 36(1) or the second closed-type squeegee mechanism 36(2) over the screen mask 32(1) or the screen mask 32(2).

Printing portions 48 are provided at lower portions of the first closed-type squeegee mechanism 36(1) and the second closed-type squeegee mechanism 36(2) so as to be brought into abutment with surfaces of the corresponding screen masks 32(1), 32(2) to load a paste P into pattern holes. A main body portion 50 which makes up the printing portion 48 is a block member having an elongated shape in a widthwise direction of the screen mask 32(1) or 32(2). A lengthwise dimension of the main body portion 50 is set so as to cover a widthwise dimension of a substrate 5 which constitutes an object of printing. A cartridge 51 in which the paste P is stored is detachably installed in the main body portion 50.

A predetermined amount of paste P is stored in the cartridge 51 in advance, and a pressurizing plate 52 for pressurizing the paste P in an interior of the cartridge 51 is fitted in an opening in an upper surface of the cartridge 51. The pressurizing plate 52 is assembled to a rod 46a of a cylinder 46 which is disposed above the pressurizing plate 52, whereby the pressurizing plate 52 moves upwards or downwards by driving the cylinder 46. The paste P within the cartridge 51 is pressed down (an arrow d) with a predetermined pressure by the pressurizing plate 52 by driving the cylinder 46 with a predetermined pressure.

A bottom surface of the cartridge 51 is made into a forcing plate 51a of the paste P, and many openings 51b are provided in the forcing plate 51a. The paste P within the cartridge 51 is pressurized by pressing down the pressurizing plate 52 by the cylinder 46 and is then pushed out downwards through the openings 51b in the forcing plate 51a while being squeezed by the openings 51b. When the paste is squeezed in the way described above, the viscosity of the paste P is reduced, whereby the paste P is modified so as to have properties suitable for printing.

A pair of facing sliding contact plates (a first sliding contact plate 54A, a second sliding contact plate 54B) extend downwards from a lower surface side of the main body portion 50 so as to approach each other to thereby contract gradually a space defined therebetween obliquely inwards as they extend downwards with the facing direction aligned with the squeegeeing direction (the Y direction). The first sliding contact plate 54A and the second sliding contact plate 54B are both a plate-shaped member and make a front wall and a rear wall of a printing space 55 in the squeegeeing direction. In such a state that the first closed-type squeegee mechanism 36(1) and the second closed-type squeegee mechanism 36(2) are lowered, lower end portions of the first sliding contact plate 54A and the second sliding contact plate 54B are in abutment with the corresponding screen masks 32(1), 32(2).

In screen printing, the paste P in the interior of the cartridge 51 is pressurized by the pressurizing plate 54, and the paste P which is forced out through the forcing plate 51a reaches the space defined below the main body portion 50, that is, the printing space 55 which is surrounded by the first sliding contact plate 54A, the second sliding contact plate 54B and the lower surface of the main body portion 50. Then, the closed-type squeegee mechanisms 36 with the paste P filled in the printing space 54 are caused to slide over the screen masks 32(1), 32(2). By doing so, the paste P within the printing space 55 is loaded in the depressed portion 32e of the fitting portion 32c of the screen mask 32(1) and the pattern holes 32f in the screen mask 32(2) via an opening defined between the first sliding contact plate 54A and the second sliding contact plate 54B.

Then, the paste P is loaded sequentially in the individual pattern holes by moving the first closed-type squeegee mechanism 36(1) and the second closed-type squeegee mechanism 36(2). Namely, the first closed-type squeegee mechanism 36(1) and the second closed-type squeegee mechanism 36(2) have the function to load the paste P in the depressed portion 32e of the fitting portion 32c of the screen mask 32(1) or the pattern holes 32f in the screen mask 32(2) via the printing opening defined between the first sliding contact plate 54A and the second sliding contact plate 54B by being caused to slide in the squeegeeing direction with the first sliding contact plate 54A and the second sliding contact plate 54B in abutment with either the upper surfaces of the screen mask 32(1) (the bottom surface printing mask) or the upper surface of the screen mask 32(2) (the upper surface printing mask) while pressurizing the paste P store in the main body portion 50.

Here, in the embodiment, the first sliding contact plate 54A and the second sliding contact plate 54B have different functions needed in relation to the squeegeeing direction with respect to the intended mask patterns, and different materials and thicknesses are used in accordance with the difference in function. Namely, in the squeegeeing operation intended to print the bottom surface printing areas 5e by use of the bottom surface printing mask pattern 32a, the sliding contact plate situated at a rear side in the squeegeeing direction is intended to scoop up an excessive paste P remaining in the depressed portion 32e in the upper surface of the fitting portion 32c to remove it from the depressed portion 32e in this squeegeeing operation.

Because of this, a material rich in flexibility such as a resin material like a urethane resin, for example, is selected for the sliding contact plate situated at the rear side in sliding on the screen mask 32(1) so that when the sliding contact plate situated at the rear side passes through the depressed portion 32e, a lower end portion of the sliding contact plate enters the depressed portion 32e to function to scoop out the paste P. In addition to the selection of material, a thickness-wise dimension of the sliding contact plate at the rear side is set so appropriately that the sliding contact plate is deformed in a desired deflection form by the printing pressure with which the main body portion 50 is pressed against the mask plate 32(1). In this way, by selecting the material rich in flexibility and the appropriate thickness-wise dimension for the sliding contact plate, the sliding contact is permitted to be deformed not only in the obliquely downward direction in which the sliding contact plate extends but also in a longitudinal direction (the X direction). By being permitted to be so deformed, when the sliding contact plate situated at the rear side passes through the depressed portion 32e, the lower end portion of the sliding contact plate enters the depressed portion 32e.

In contrast to this, in the squeegeeing operation intended to print the upper surface printing area 5d by use of the upper surface printing mask pattern 32B, the sliding contact plate situated at the rear side in the squeegeeing direction is intended to scrape off the paste adhering to an upper surface 32g of the mask pattern 32b in an ensured fashion. Because of this, a material having large rigidity such as a metallic material like a stainless steel, for example, is selected for the sliding contact plate situated at the rear side in sliding on the screen mask 32(2) so that when a lower end portion of the sliding contact plate situated at the rear side is pressed against the upper surface 32g so as to be closely attached thereto. In addition to the selection of material, a thickness-wise dimension of the sliding contact plate at the rear side is set so appropriately that the sliding contact plate is deformed in a desired deflection form by the printing pressure with which the main body portion 50 is pressed against the mask plate 32(2) so that a lower end portion of the sliding contact plate is closely attached to the mask plate 32(2).

In screen printing a substrate 5 by the screen printing apparatus 1, the substrate 5 is aligned sequentially with the screen mask 32(1) (the bottom surface printing mask) of the upstream side printing portion 2(1) and the screen mask 32(2) (the upper surface printing mask) of the downstream side printing portion 2(2), and the paste P is printed sequentially on the substrate 5 by the first closed-type squeegee mechanism 36(1) and the second closed-type squeegee mechanism 36(2). Screen printing at the upstream side printing portion 2(1) and the downstream side printing portion 2(2) will be described by reference to FIGS. 7 and 8. Here, in either of the first closed-type squeegee mechanism 36(1) of the upstream side printing portion 2(1) and the second closed-type squeegee mechanism 36(2) of the downstream side printing portion 2(2), a sliding contact plate made of a material rich in flexibility such as a urethane resin is described as being used as the first sliding contact plate 54A, and a sliding contact plate with large rigidity made of a metal or hard resin is described as being used as the second sliding contact plate 54B.

Figure 7A:
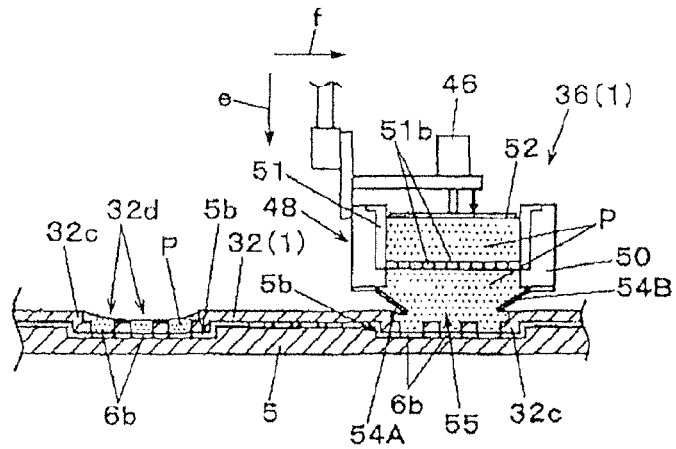
FIGS. 7(a), 7(b), 7(c) are explanatory drawings explaining operations of the screen printing apparatus of the embodiment of the invention.

Firstly, the substrate 5 is transferred to the upstream side printing portion 2(1), where the substrate 5 is positioned with respect to the screen mask 32(1) by the substrate positioning portion 21 and is brought into abutment with the screen mask 32(1) from a lower surface side thereof. As the result of these actions, as is shown in FIG. 7(a), the fitting portion 32c of the screen mask 32(1) fits in the recess portion 5b in the substrate 5. Then, in this state, the first sliding contact plate 54B and the second sliding contact plate 54B are brought into abutment with the screen mask 32(1) by lowering the closed-type squeegee mechanism 36 (an arrow e). Following this, the first closed-type squeegeeing mechanism 36(1) is moved in the squeegeeing direction (an arrow f). As this occurs, the moving direction of the first closed-type squeegee mechanism 36(1) is set so that the first sliding contact plate 54A comes to be situated at a rear side in the squeegeeing direction.

Figure 7B:
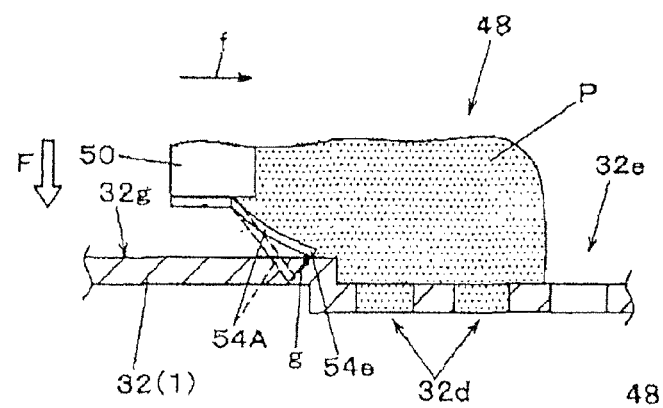
Figure 7C:
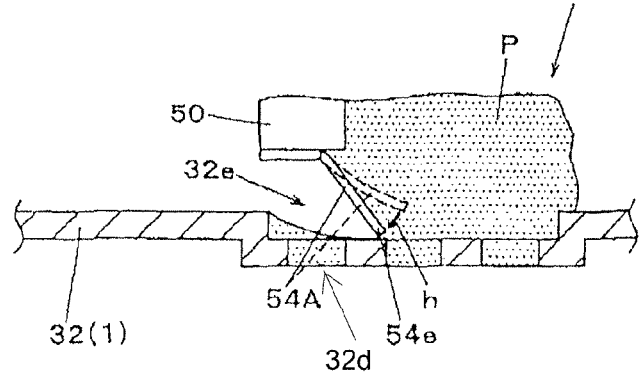

FIGS. 7(b), (c) show behaviors of the first sliding contact plate 54A when it passes through the depressed portion 32e. Namely, the first sliding contact plate 54A is deflected (an arrow g) by the main body portion 50 being pressed against the screen mask 32(1) by the printing pressure F, and the printing portion 48 performs a squeegeeing operation in this state. Then, when the printing portion 48 advances, causing the first sliding contact plate 54 to move into the depressed portion 32e, since the first sliding contact plate 54A is made of the material rich in flexibility, the first sliding contact plate 54A is deformed (an arrow h) from a state shown in FIG. 7(b) by a spring-back force resulting from the deflected deformation in a direction in which the first sliding contact plate 54A enters the depressed portion 32e as is shown in FIG. 7(c). By this action of the first sliding contact plate 54A, the paste P remaining within the depressed portion 32e is scooped up by the first sliding contact plate 54A for removal therefrom. Namely, in this embodiment, the material and thickness of the first sliding contact plate 54A situated at the rear side with respect to the squeegeeing direction of the first closed-type squeegee mechanism 36(1) are selected so that the first sliding contact plate 54A is deflected to be deformed by the printing pressure with which the first closed-type squeegee mechanism 36(1) is pressed against the upper surface of the screen mask 32(1) which is the bottom surface printing mask in the squeegeeing operation, so that a lower end portion 54e enters the depressed portion 32e by virtue of a spring back force resulting from the deflected deformation.

Figure 8A:
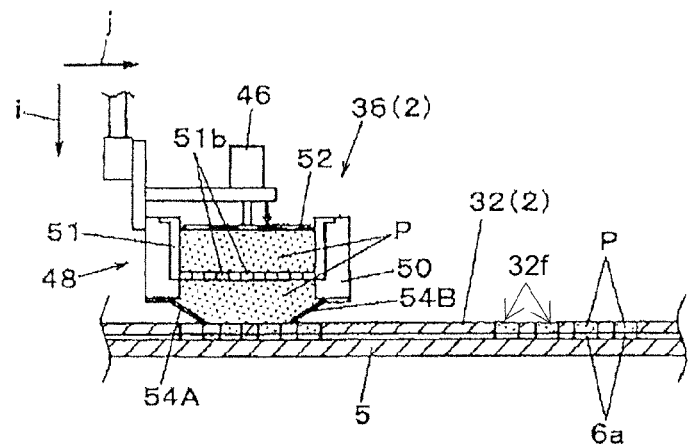
FIGS. 8(a), 8(b) are explanatory drawings of the screen printing apparatus of the embodiment of the invention.

Next, the substrate 5 is transferred to the downstream side printing portion 2(2), and the substrate 5 is positioned relative to the screen mask 32(2) by the substrate positioning portion 21 and is brought into the screen mask 32(2) from the lower surface side thereof. By the substrate 5 being brought into abutment with the screen mask 32(2) in that way, as is shown in FIG. 8(a), the pattern holes 32f in the screen mask 32(2) are aligned with the upper surface electrodes 6a of the substrate 5. Then, in this state, the second closed-type squeegee mechanism 36(2) is lowered (an arrow i), so that the first sliding contact plate 54A and the second contact plate 54B are brought into abutment with the screen mask 32(2). Then, the closed-type mechanism 36 is moved in the squeegee direction (arrow j). As this occurs, the moving direction of the second closed-type squeegee mechanism 36(2) is set so that the sliding contact plate 54B is situated at the rear side in the squeegeeing direction.

Figure 8B:
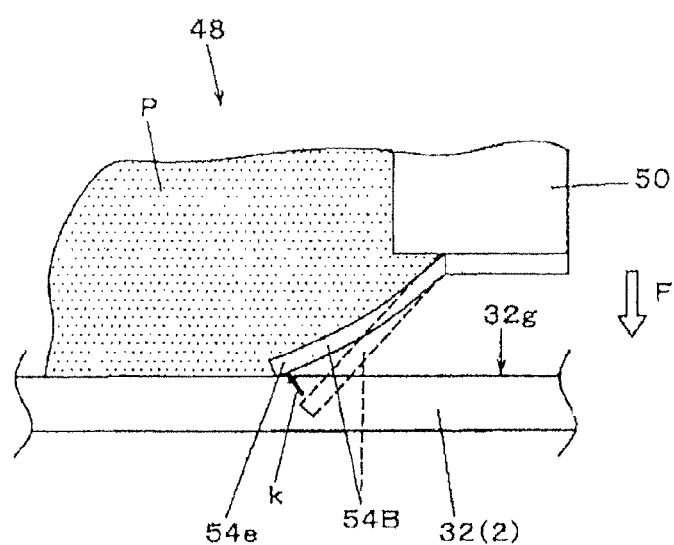

FIG. 8(b) shows behaviors of the second closed-type sliding contact plate 54B when it slides over an upper surface 32g of the screen mask 32(2). Namely, the second sliding contact plate 54b is deflected (an arrow k) by the main body portion 50 being pressed against the screen mask 32(2) by virtue of the printing pressure F, and the printing portion 48 implements the squeegeeing operation in this state. Then, when the printing portion 48 advances to continue squeegeeing, since the second sliding contact plate 54B is made of the material having rigidity, the lower end portion 54e of the second sliding contact plate 54B is pressed against the upper surface 32g by a reaction force to the deflection in accordance with the printing pressure to thereby be closely attached to the upper surface 32g.

By the second sliding contact plate 54B being closely attached to the upper surface 32g, the paste P adhering to the upper surface 32g is separated to be scraped off the upper surface 32g by the second sliding contact plate 54B. Namely, in this embodiment, the thickness and material of the second sliding contact plate 54B which is situated at the rear side with respect to the squeegeeing direction of the second closed-type squeegee mechanism 36(2) are set so that the lower end portion 54e is closely attached to the upper surface 32g by virtue of the printing pressure with which the second closed-type squeegee mechanism 36(2) is pressed against the upper surface 32g of the mask plate 32(2) which is the upper surface printing mask in the squeegeeing operation so as to separate to scrape the paste adhering to the upper surface 32g thereof.

In the screen printing method for printing the electronic parts joining paste on the substrate 5 sequentially in the two stages by the upstream side printing portion 2(1) and the downstream side printing portion 2(2) of the screen printing apparatus 1 which are intended for the upper surface printing area 5d which is set on the upper surface 5a of the substrate 5 and on which the upper electrodes 6a are formed and the bottom surface printing area 5e which is set on the bottom surface of the recess portion 5b which is opened in the upper surface 5a and on which the bottom surface electrodes 6b are formed, in the bottom surface printing step by the upstream side printing portion 2(1) which is intended for the bottom surface printing area 5e, the first sliding contact plate 54A of the pair of sliding contact plates of the first closed-type squeegee mechanism 36(1) which is situated at the rear side with respect to the squeegeeing direction in the squeegeeing operation scoops up the paste P remaining in the depressed portion 32e in the upper surface side of the fitting portion 32c for removal therefrom, and in the upper surface printing step by the downstream side printing portion 2(2) which is intended for the upper surface printing area 5d, the second sliding contact plate 54B of the pair of sliding contact plates of the second closed-type squeegee mechanism 36(2) which is situated at the rear side with respect to the squeegeeing direction in the squeegeeing operation scrapes the paste P adhering the upper surface 32g of the screen mask 32(2) which is the upper surface printing mask thereof.

By adopting the screen printing method described above, the various restrictions and problems existing conventionally in the screen printing intended for the cavity substrate can be solved, and the printing work can be implemented with good efficiency while securing the good printing quality in the screen printing intended for the upper surface of the substrate and the bottom surface of the recess portion which is opened in the upper surface.

In the upstream side printing portion 2(1) and the downstream side printing portion 2(2), when the first closed-type squeegee mechanism 36(1) and the second closed-type squeegee mechanism 36(2) are reciprocated in both the directions to make them implement the squeegeeing operations, since the first sliding contact plate 54A and the second sliding contact plate 54B are situated alternately at the rear side with respect to the squeegeeing direction, the materials and thicknesses described above are adopted for the two sliding contact plates. Namely, in the first closed-type squeegee mechanism 36(1) of the upstream side printing portion 2(1), the material rich in flexibility is used for either of the first sliding contact plate 54A and the second sliding contact plate 54B, whereas in the second closed-type squeegee mechanism 36(2) of the downstream side printing portion 2(2), the material with large rigidity is used for either of the first sliding contact plate 54A and the second sliding contact plate 54B.

This patent application is based on Japanese Patent Application (No. 2009-161331) filed on Jul. 8, 2009, the contents of which are incorporated herein by reference.

<Industrial Applicability>

In the screen printing intended to print the upper surface of the substrate and the bottom surface of the recess portion which is opened in the upper surface, the screen printing apparatus and the screen printing method of the invention have the advantage that the printing work can be implemented with good efficiency while securing the good printing quality and are useful in the industrial field in which the electronic parts joining paste is printed on the printing areas of the cavity substrate which differ in height.

Description of Reference Numerals and Character

1 Screen Printing Apparatus (Electronic Parts Packaging Line); 2(1) Upstream Side Printing Portion; 2(2) Downstream Side Printing Portion; 4(1), (2), (3) Substrate Distribution Device; 5 Substrate; 5A Upper Surface; 5b Recess Portion; 5d Upper Surface Printing Area; 5e Bottom Surface Printing Area; 6a Upper Surface Electrode; 6b Bottom Surface Electrode; 21 Substrate positioning Portion; 32(1) Screen Mask (Bottom Surface Printing Mask); 32(2) Screen Mask (Upper Surface Printing Mask); 32a, 32b Mask Pattern; 32c Recess Portion; 32d Pattern Hole; 32e Depressed Portion; 33 Squeegee Moving Mechanism; 36(1) First Closed-type Squeegeeing Mechanism; 36(2) Second Closed-type Squeegeeing Mechanism; 50 Main Body Portion; 54A First Sliding Contact Plate; 54B Second Sliding Contact Plate; P Paste.

The invention claimed is:

1. A screen printing apparatus for printing an electronic parts joining paste on an upper printing area which is set on an upper surface of a substrate and on which an upper surface electrode is formed and a bottom surface printing area which is set on a bottom surface of a recess portion which is opened in the upper surface and on which a bottom surface electrode is formed as objects, comprising:

an upstream side printing portion and a downstream side printing portion which are disposed in series along a direction in which a substrate is transferred for printing the paste on the substrate as an object sequentially in two stages and a substrate transfer portion for transferring the substrate from the upstream side printing portion to the downstream side printing portion;

wherein the upstream side printing portion comprises a bottom surface printing mask which is provided to correspond to the bottom printing area and which has a fitting portion adapted to fit in the recess portion and a mask pattern formed in the fitting portion so as to correspond to the bottom surface electrode and a first closed-type squeegee mechanism which is configured to include a pair of facing sliding contact plates which extend downwards from a lower surface of a main body portion which stores the paste so as to approach each other to contract gradually a space defined therebetween as they extend downwards with the facing direction aligned with a squeegeeing direction and which supplies the paste into the fitting portion via a printing opening provided between the sliding contact plates by bringing the sliding contact plates into abutment with an upper surface of the bottom printing mask to cause them to slide in the squeegeeing direction while pressurizing the paste stored in the main body portion, the downstream side printing portion comprises an upper surface printing mask which is provided to correspond to the upper surface printing area and which has a mask pattern formed so as to correspond to the upper surface electrode and a second closed-type squeegee mechanism which is configured in a similar way to the first closed-type squeegee mechanism and which loads the paste into pattern holes provided in the upper surface printing mask via a printing opening provided between a pair of sliding contact plates by bringing the sliding contact plates into abutment with an upper surface of the upper surface printing mask to cause them to slide in the squeegeeing direction while pressurizing the paste stored in the main body portion, of the pair of sliding contact plates of the first closed-type squeegee mechanism, a sliding contact plate which is situated at a rear side in the squeegeeing direction in a squeegeeing operation intended for the bottom surface printing area as a printing object scoops out the paste remaining in a depressed portion on an upper surface side of the fitting portion for removal from the depressed portion, of the pair of sliding contact plates of the second closed-type squeegee mechanism, a sliding contact plate which is situated at a rear side in the squeegeeing direction in a squeegeeing operation intended for the upper surface printing area as a printing object scrapes off the paste adhering to an upper surface of the upper surface printing mask.

2. The screen printing apparatus as set forth in claim 1, wherein a thickness and material of the sliding contact plate at the rear side of the first closed-type squeegee mechanism are selected so that the sliding contact plate is deflected to be deformed by a printing pressure with which the first closed-type squeegee mechanism is pressed against the upper surface of the bottom surface printing mask in the squeegeeing operation, causing a lower end portion thereof to enter the depressed portion by the deflected deformation.

3. A screen printing apparatus as set forth in claim 1, wherein a thickness and material of the sliding contact plate at the rear side of the second closed-type squeegee mechanism are selected so that the sliding contact plate is closely attached to the upper surface of the upper surface printing mask by a printing pressure with which the second closed-type squeegee mechanism is pressed against the upper surface in the squeegeeing operation so as to scrape off the paste adhering thereto.

4. A screen printing method for printing an electronic parts joining paste on a substrate as an object sequentially in two stages by an upstream side printing portion and a downstream side printing portion which are disposed in series along a substrate transferring direction to be intended respectively for an upper printing area which is set on an upper surface of the substrate and on which an upper surface electrode is formed and a bottom surface printing area which is set on a bottom surface of a recess portion which is opened in the upper surface and on which a bottom surface electrode is formed, comprising:

a bottom surface printing step implemented by the upstream side printing portion intended for the bottom surface printing area in which the substrate is aligned with a bottom surface printing mask which has a fitting portion provided to correspond to the bottom surface printing area and adapted to fit in the recess portion and a mask pattern formed in the fitting portion so as to correspond to the bottom electrode and a first closed-type squeegee mechanism which is configured to include a pair of facing sliding contact plates which extend downwards from a lower surface of a main body portion which stores the paste so as to approach each other to contract gradually a space defined therebetween as they extend downwards with the facing direction aligned with a squeegeeing direction is brought into abutment with an upper surface of the bottom surface printing mask so as to supply the paste into the fitting portion via a printing opening provided between the sliding contact plates by bringing the sliding contact plates into abutment with the upper surface of the bottom printing mask to cause them to slide in the squeegeeing direction while pressurizing the paste stored, in the main body portion; and an upper surface printing step implemented by the downstream side printing portion intended for the upper surface printing area in which the substrate is aligned with an upper surface printing mask which is provided to correspond to the upper surface printing area and which has a mask pattern formed so as to correspond to the upper surface electrode and a second closed-type squeegee mechanism which is configured in a similar way to the first closed-type squeegee mechanism is brought into abutment with an upper surface of the upper surface printing mask so as to load the paste into pattern holes provided in the upper surface printing mask via a printing opening provided between a pair of sliding contact plates by bringing the sliding contact plates into abutment with the upper surface of the upper surface printing mask to cause them to slide in the squeegeeing direction while pressurizing the paste stored in the main body portion, wherein, in the bottom surface printing step, of the pair of sliding contact plates of the first closed-type squeegee mechanism, a sliding contact plate which is situated at a rear side in the squeegeeing direction in a squeegeeing operation scoops out the paste remaining in a depressed portion on an upper surface side of the fitting portion for removal from the depressed portion, and in that in the upper surface printing step, of sliding contact plates of the second closed-type squeegee mechanism, a sliding contact plate which is situated at a rear side in the squeegeeing direction in a squeegeeing operation scrapes off the paste adhering to the upper surface of the upper surface printing mask.

* * * * *